(12) United States Patent
Chang et al.

(10) Patent No.: US 7,450,352 B2
(45) Date of Patent: Nov. 11, 2008

(54) FABRICATION OF MAGNETIC TUNNEL JUNCTIONS WITH EPITAXIAL AND TEXTURED FERROMAGNETIC LAYERS

(75) Inventors: Y. Austin Chang, Middleton, WI (US); Jianhua Joshua Yang, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 408 days.

(21) Appl. No.: 11/169,320

(22) Filed: Jun. 28, 2005

(65) Prior Publication Data

US 2006/0291105 A1 Dec. 28, 2006

(51) Int. Cl.
*G11B 5/33* (2006.01)
*G11B 5/39* (2006.01)
*G11B 5/127* (2006.01)

(52) U.S. Cl. .................................................. 360/324.2
(58) Field of Classification Search ................ 360/324.2
See application file for complete search history.

(56) References Cited

U.S. PATENT DOCUMENTS

| | | | |
|---|---|---|---|
| 5,640,343 | A | 6/1997 | Gallagher et al. |
| 5,729,410 | A | 3/1998 | Fontana, Jr. et al. |
| 6,261,646 | B1 | 7/2001 | Chen et al. |
| 6,296,741 | B1 | 10/2001 | Pinarbasi |
| 6,359,289 | B1 | 3/2002 | Parkin |
| 6,452,204 | B1 | 9/2002 | Ishiwata et al. |
| 6,655,006 | B2 | 12/2003 | Pinarbasi |
| 6,693,774 | B2 | 2/2004 | Watanabe et al. |
| 2001/0026981 | A1* | 10/2001 | Bower et al. ................. 438/297 |
| 2004/0145850 | A1 | 7/2004 | Fukumoto et al. |
| 2005/0029629 | A1* | 2/2005 | Noguchi et al. .............. 257/627 |
| 2006/0021213 | A1 | 2/2006 | Chang et al. |
| 2006/0098354 | A1* | 5/2006 | Parkin ....................... 360/324.2 |
| 2006/0176735 | A1* | 8/2006 | Yuasa .......................... 365/173 |
| 2006/0221510 | A1* | 10/2006 | Parkin ....................... 360/324.2 |
| 2007/0141823 | A1* | 6/2007 | Preble et al. ................ 438/604 |

OTHER PUBLICATIONS

W. Wulfhekel et al., "Single Crystal Magnetotunnel Junctions," Jan. 22, 2001, Applied Physics Letters, vol. 78, No. 4, pp. 509-511.*

M. Bowen et al., "Large Magnetoresistance in Fe/MgO/FeCo(001) Epitaxial Tunnel Junctions on GaAs(001)," Sep. 10, 2001, Applied Physics Letters, vol. 79, No. 11, pp. 1655-1657.*

J. Faure-Vincent et al., "High Tunnel Magnetoresistance in Epitaxial FeMgO/Fe Tunnel Junctions," Jun. 23, 2003, Applied Physics Letters, vol. 82, No. 25, pp. 4507-4509.*

Shinji Yuasa et al., "High Tunnel Magnetoresistance at Room Temperature in Fully Epitaxial Fe/MgO/Fe Tunnel Junctions Due To Coherenet Spin-Polarized Tunneling," Apr. 2, 2004, Japanese Journal of Applied Physics, vol. 43, No. 4B, pp. L588-L590.*

(Continued)

*Primary Examiner*—William J Klimowicz
(74) *Attorney, Agent, or Firm*—Foley & Lardner LLP

(57) ABSTRACT

This invention relates to magnetic tunnel junctions and methods for making the magnetic tunnel junctions. The magnetic tunnel junctions include a tunnel barrier oxide layer sandwiched between two ferromagnetic layers both of which are epitaxial or textured with respect to the underlying substrate upon which the magnetic tunnel junctions are grown. The magnetic tunnel junctions provide improved magnetic properties, sharper interfaces and few defects.

22 Claims, 5 Drawing Sheets

OTHER PUBLICATIONS

Stuart S. Parkin et al., "Giant Tunneling Magnetoresistance at Room Temperature with MgO (100) Tunnel Barriers," Oct. 31, 2004, Nature Publishing Group, vol. 3, pp. 862-867.*

Shinji Yuasa et al., "Giant Room Temperature Magnetoresistance in Single Crystal Fe/MgO/Fe Magnetic Tunnel Junctions," Oct. 31, 2004, Nature Publishing Group, vol. 3, pp. 868-871.*

P. Sutta and Q. Jackuliak, "X-Ray Diffraction Line Profile Analysis of Strongly Textured Thin Films, Materials Structure" 1998, pp. 10-14, vol. 5, No. 1, Department of Physics, Faculty of Logistics, Military Academy 031 11 Lipovsky Mikulas, Slovak Republic; Department of Technical Physics, Faculty of Electrical Engineering, University of ilina, 010 26 ilina, Slovak Republic.

E. Guilmeau, S. Lambert, D. Chateigner, J.G. Noudem, B. Ouladiaf, "Quantitative Texture Analysis of Polyphased Oxides by Diffraction: Example of Bi2223 Sinter-Forged Ceramic and Y123 Foam Superconductors" Materials Science & Engineering, 2003, pp. 107-112, B104, Elsevier B. V.

Jianhua Yang, Ying Yang and Y. Austin Chang, "A Research Progress Report: Part II" Power Point slides presented in oral presentation to Seagate Technology on Aug. 3, 2004.

Ji Hyung Yu, Hyuck Mo Lee, Yasuo Ando and Terunobu Miyazaki, "Electron Transport Properties in Magnetic Tunnel Junctions with Epitaxial NiFe (111) Ferromagnetic Bottom Electrodes" Applied Physics Letters, Jun. 30, 2003, pp. 4735-4737.

F. Shen, T. Zhu, et al., "Observation of the Barrier Structure in Magnetic Tunnel Junctions using High-Resolution Electron Microscopy and Electron Holography" Applied Physics Letters, Dec. 29, 2003, pp. 5482-5484, vol. 83, No. 26, American Institute of Physics.

S. Mitani, T. Moriyama, and K. Takanashi, "Fe/MgO/FeCo(100) Eptiaxial Magnetic Tunnel Junctions Prepared by Using In Situ Plasma Oxidation" Journal of Applied Physics, May 15, 2003, pp. 8041-8043, vol. 93, No. 10, American Institute of Physics.

Satoshi Sugahara and Masaaki Tanaka, "Tunneling Magnetoresistance in Fully Epitaxial MnAs/AlAs/MnAs Ferromagnetic Tunnel Junctions Grown on Vicinal GaAs(111)B Substrates" Applied Physics Letters, Mar. 18, 2002, ppl. 1969-1971, vol. 80, No. 11, American Institute of Physics.

C. Martinez Boubeta, J. L. Costa-Kramer and A Cebollada, "Epitaxy, Magnetic and Tunnel Properties of Tran sition Metal/MgO(001) Heterostructures" Journal of Physics: Condensed Matter, 2003, pp. R1123-R1167, Matter 15, Institute of Physics Publishing.

I. I. Oleynik, E. Y. Tysmbal, "Metal-Oxide Interfaces in Magnetic Tunnel Junctions" Interface Science 2004, pp. 105-116, vol. 12, Kluwer Acedemic Publishers.

M. Bowen, M. Bibes, A. Barthelemy, J.P. Contour, A. Anane, Y. Lemaitre, and A. Fert, "Nearly Total Spin Polarization in La$_{2/3}$Sr$_{1/3}$MnO$_3$ from Tunneling Experiments" Applied Physics Letters, Jan. 13, 2003, pp. 223-235, vol. 82, No. 2, American Institute of Physics.

G. Banach and W. M. Temmerman, "Delocalization and Charge Disproportionation in La$_{(1-x)}$Sr$_{x+}$MnO$_3$" Physical Review 2004, pp. 054427-1-054427-8, vol. 69, The American Physical Society.

D. Lacour, O. Durand, J.-L. Maurice, H. Jaffres, F. Nguyen Van Dau, F. Petroff, P. Etienne, J. Humbert, A. Vaures, "On the Use of Exchange Biased Top Electrodes in Magnetic Tunnel Junctions" Journal of Magnetism and Magnetic Materials 270, 2004, pp. 403-406, Elsevier B. V.

Moodera, et al., "Optimum tunnel barrier in ferromagnetic-insulator-ferromagnetic tunneling structures" Appl. Phys. Lett. 70 (22), pp. 3050-3052, 1997. Published by American Institute of Physics.

Zhu, et al., "Determination of the thickness of Al oxide films used as barriers in magnetic tunneling junctions" Applied Physics Letters, 78 (20)., pp. 3103-3105, 2001. Published by the American Institute of Physics.

Kottler, et al., "An in situ x-ray photoelectron spectroscopy study of AlO$_x$ spin tunnel barrier formation" Journal of Applied Physics, 89 (6), pp. 3301-3306, 2001. Published by American Institute of Physics.

Ladwig, et al. "Fabrication of Thermodynamically Stable Oxide Layers for Use in Tunneling Magnetoresistive (TMR) Readers." A proposal submitted to Seagate Technology on Jul. 30, 2002.

Ladwig, et al. "Fabrication of Thermodynamically Stable Oxide Layers for Use in Tunneling Magnetoresistive (TMR) Readers." A proposal submitted to Seagate Technology on Sep. 30, 2002.

Yang. "Fabrication of Thermodynamically Stable Oxide Layers for Use in Tunneling Magnetoresistive (TMR) Readers." Written report for Research Readiness Exam presented by Jianhua Yang to his research committee on Aug. 2003.

Chang. "Fabrication of Thermodynamically Stable Oxide Layers for Use in Tunneling Magnetoresistive Readers." Power Point slides from oral presentation at Seagate Techology, Oct. 6, 2003.

Pages 148-167; 187-188; 247-258 and 264-271 of Peter Ladwig's thesis presented on Jul. 30, 2003 and cataloged Feb. 6, 2004.

"A research progress report on H$_2$O/H$_2$ gas mixture." PowerPoint slides presented in oral presentation to Seagate Technology on Feb. 6, 2004.

Sakuraba, Y. et al., "Giant tunneling magnetoresistance in Co$_2$MnSi/Al-O/Co$_2$MnSi magnetic tunnel junctions," Applied Physics Letters, vol. 88, 192508 (2006); published by American Institute of Physics.

Smith, D. J. et al., "Structural characterization of thin film ferromagnetic tunnel junctions," J. Appl. Phys., vol. 83, No. 10, May 15, 1998; published by American Institute of Physics.

Platt, C. L. et al., "Spin polarized tunneling in reactively sputtered tunnel junctions," J. Appl. Phys., vol. 81, No. 8, Apr. 15, 1997; published by American Institute of Physics.

* cited by examiner

FABRICATION OF MAGNETIC TUNNEL JUNCTIONS WITH EPITAXIAL AND TEXTURED FERROMAGNETIC LAYERS

STATEMENT OF GOVERNMENT RIGHTS

Research funding was provided for this invention by the United States Department of Energy under grant No. DE-FG02-99ER45777. The United States government has certain rights in this invention.

FIELD OF THE INVENTION

The present invention relates generally to magnetic tunnel junctions. More specifically, the invention relates to magnetic tunnel junctions having epitaxial or textured ferromagnetic layers and to methods for fabricating the same.

BACKGROUND

The demand for increasing areal density in the magnetic storage industry drives the search for new magnetoresistive readers with increased sensitivity. The tunneling magnetoresistive (TMR) read head is one device that has been investigated recently as a highly sensitive magnetoresistive reader. A TMR utilizes a magnetic tunnel junction (MTJ) composed of a tunnel barrier layer made from a non-magnetic insulating material sandwiched between two ferromagnetic layers. The insulating layer is thin enough to permit quantum-mechanical tunneling of charge carriers between the ferromagnetic layers. The tunneling is electron spin-dependent and, therefore, the tunneling current depends on the spin-dependent electronic properties of the ferromagnetic materials and the relative orientations of the magnetization directions of the ferromagnetic layers. For this reason, the two ferromagnetic layers are designed to have different responses to magnetic fields so that the orientation of their magnetic moments may be varied by an external magnetic field. One of the ferromagnetic layers in the MTJ, called the pinned layer, is composed of a material whose magnetic moment does not rotate in response to an applied magnetic field in the device's range of interest. In some MTJs the ferromagnetic layer is pinned by being exchange coupled to an antiferromagnetic layer. The other ferromagnetic layer is a free layer, that is, its magnetic moment is free to respond to an applied magnetic field in the device's range of interest.

Some MTJs include a tunnel barrier layer doped with magnetic particles. This doping provides an increase in magnetoresistance and an improved signal to noise ratio. For example, some MTJs have an aluminum oxide tunnel barrier layer doped with magnetic particles such as cobalt, iron or nickel particles.

The performance of MTJs depends to a large degree on the quality of the microstructures of the ferromagnetic and tunnel barrier layers. Compared with polycrystalline ferromagnetic layers, epitaxial ferromagnetic layers are highly desirable because they can reduce spin-flip scatterings and additionally enable one to control their crystal orientations to achieve high spin polarization yielding high magnetoresistive ratios. Unfortunately most MTJs presently available have only a single epitaxial ferromagnetic layer grown on an underlying substrate. Following the growth of this epitaxial ferromagnetic layer, conventional approaches to fabricating MTJs involve depositing a thin metal layer over the epitaxial ferromagnetic layer and exposing the metal to an oxidizing environment, such as air or pure oxygen, in order to oxidize the metal and form a thin tunnel barrier metal oxide layer. A second ferromagnetic layer is then grown over the tunnel barrier metal oxide layer. However, this second ferromagnetic layer is typically grown as a polycrystalline layer with random crystallographic orientations.

Other MTJs have a fully epitaxial structure where the first and second ferromagnetic layers as well as the tunnel barrier layer are all grown epitaxially on a substrate. Unfortunately, in order to have a lattice match between the tunnel barrier layer and the second ferromagnetic layer, only limited substrates are available. To date, no fully epitaxial MTJs have successfully been grown on a silicon (Si) substrate. For example, MTJs having an epitaxial MgO tunnel barrier oxide layer grown on an epitaxial iron (Fe) ferromagnetic layer have been developed. However, epitaxial growth of Fe cannot be carried out on a Si substrate. Therefore, the fully epitaxial MTJs presently available cannot take advantage of well established silicon processing techniques and have limited industrial applicability.

Thus, a need exists for a magnetic tunnel junction with two epitaxial ferromagnetic layers that may be grown on a variety of substrates, including silicon substrates.

SUMMARY OF THE INVENTION

This invention relates to magnetic tunnel junctions and methods for making the magnetic tunnel junctions. The magnetic tunnel junctions include an underlying substrate, a first ferromagnetic layer deposited on the substrate, a tunnel barrier oxide layer deposited on the first ferromagnetic layer and a second ferromagnetic layer deposited on the tunnel barrier oxide layer. In some of the multi-layered structures the first and second ferromagnetic layers are desirably epitaxial with respect to the underlying substrate. In some of the multi-layered structures the first and second ferromagnetic layers are desirably textured. The underlying substrate may be a silicon substrate.

The tunnel barrier oxide layer may be composed of a metal oxide, a metal alloy oxide or semiconductor oxide. Examples of suitable materials for use as tunnel barrier oxide layers include aluminum oxide and yttrium oxide.

Suitable examples of ferromagnetic materials for use as the ferromagnetic layers include cobalt (Co), nickel (Ni), iron (Fe), alloys of cobalt and iron ("Co—Fe alloys") and alloys of nickel and iron ("Ni—Fe alloys").

The magnetic tunnel junctions may be produced from multi-layered structures that include a substrate, a first epitaxial or textured ferromagnetic layer deposited on the substrate, an epitaxial tunnel barrier precursor layer deposited on the first ferromagnetic layer and a second epitaxial or textured ferromagnetic layer deposited on the tunnel barrier precursor layer. In accordance with the present methods, these multi-layered structures may be converted into MTJs by oxidizing the tunnel barrier precursor layer through the second ferromagnetic layer to form a tunnel barrier oxide layer. After the oxidation of the tunnel barrier precursor layer, the ferromagnetic layers remain epitaxial or textured and unoxidized.

A typical method for producing the MTJs includes the steps of growing or depositing a tunnel barrier precursor material on a first ferromagnetic layer, growing or depositing a second ferromagnetic layer on the tunnel barrier precursor layer, and exposing the tunnel barrier precursor material, now sandwiched between the two ferromagnetic layers, to an oxidizing gas having an oxygen partial pressure that is low enough to provide for the controlled and selective oxidation of the tunnel barrier precursor material under conditions wherein the formation of the tunnel barrier oxide is thermodynamically stable and the formation of oxides of the ferromagnetic materials is not. Using these methods, the tunnel barrier precursor layer may be oxidized through one or both of the ferromagnetic layers. In some instances the partial pressure of oxygen used to oxidize the precursor materials may be $10^{-50}$ Torr or even lower. Such low oxygen partial pressures are difficult to achieve using air or $O_2$ as an oxidizing gas. However, such low oxygen partial pressures may be readily achieved and carefully controlled in the present methods by controlling the ratio of partial pressures of a first gas and a second gas in an oxidizing gas composed of a mixture of the two gases. Examples of gas mixtures that may be used to achieve sufficiently low oxygen partial pressures include a mixture of carbon monoxide (CO) (i.e., the first gas) and carbon dioxide ($CO_2$) (i.e., the second gas) or a mixture of hydrogen gas ($H_2$) (i.e., the first gas) and water ($H_2O$) (i.e., the second gas). In order to speed up the kinetics of oxidation, the oxidation may be carried out at elevated temperatures and pressures.

The MTJs provided herein are well suited for use in a variety of magnetic sensor and storage devices, including magnetoresistive read heads and nonvolatile random access memory.

Further objects, features and advantages of the invention will be apparent from the following detailed description when taken in conjunction with the accompanying drawings.

DETAILED DESCRIPTION OF THE INVENTION

This invention relates to MTJs composed of a tunnel barrier oxide layer sandwiched between two ferromagnetic layers. In some embodiments both ferromagnetic layers are epitaxial with respect to an underlying substrate while the tunnel barrier oxide layer is typically an amorphous layer. In other embodiments both ferromagnetic layers are textured. In still other embodiments one ferromagnetic layer is epitaxial with respect to an underlying substrate while the other ferromagnetic layer is textured with respect to the underlying substrate. The tunnel barrier oxide layer is typically an amorphous layer. The MTJs are generally characterized by uniform tunnel barrier oxide layers, reduced interfacial roughness and fewer defects than other MTJs presently known. Moreover, the crystal orientations of the ferromagnetic layers can be controlled to achieve high spin polarization. These characteristics lead to higher tunneling magnetoresistance ratios and reduced bias dependence in for MTJs.

A textured ferromagnetic layer is a polycrystalline ferromagnetic layer wherein the crystalline grains that make up the layer are aligned in a preferred orientation along certain crystalline orientations. These differ from randomly oriented polycrystalline materials. Various methods of conducting texture analysis are known in the art. These include techniques based on X-ray, neutron and electron diffraction etc. For the purposes of this invention, a ferromagnetic layer may be considered textured if the full width half maximum of the rocking curve for an XRD analysis of the layer is no more than about 20°. This includes embodiments where the layer has strong texture, corresponding to a rocking curve with a FWHM of no more than about 15° and further includes embodiments where the layer has very strong texture, corresponding to a rocking curve with a FWHM of no more than about 5°.

Figure 1:
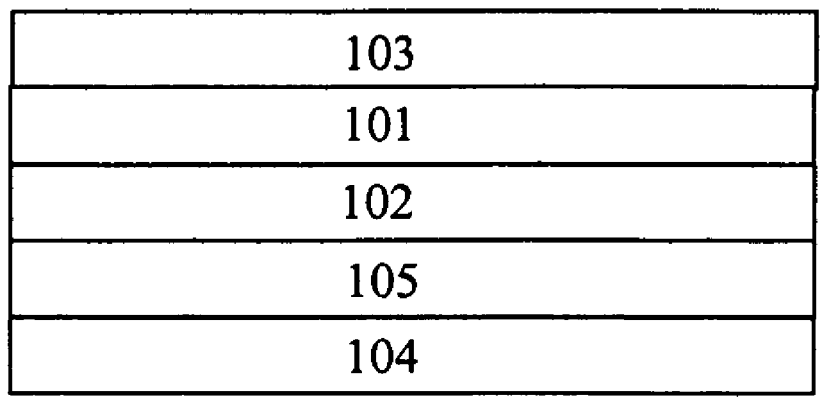
FIG. 1 is a schematic diagram showing a magnetic tunnel junction.

FIG. 1 is a schematic diagram of an MTJ 100 in accordance with the present invention. As shown in the figure, the MTJ generally includes an oxide tunnel barrier layer 101 sandwiched between a first ferromagnetic layer 102 and a second ferromagnetic layer 103. The MTJ is grown on a substrate 104. Optionally, a buffer layer 105 may be deposited between the first ferromagnetic layer 102 and the substrate 104.

The invention is based, at least in part, on the inventors' discovery that a tunnel barrier precursor layer positioned between two ferromagnetic layers can be oxidized through one or both of the ferromagnetic layers to provide a tunnel barrier oxide, without oxidizing the ferromagnetic layers. This discovery may be used to produce MTJs having amorphous, polycrystalline, epitaxial or textured ferromagnetic layers. However, as one of skill in the art would recognize there are advantages to MTJs having epitaxial or textured ferromagnetic layers. Thus, the MTJs may be formed from a multi-layered structure composed of a first ferromagnetic layer which is grown epitaxially or with texture over an underlying substrate, a tunnel barrier precursor layer grown epitaxially on the first ferromagnetic layer and a second ferromagnetic layer grown epitaxially or with texture on the tunnel barrier precursor layer. After this multi-layered structure is formed; the tunnel barrier precursor layer is selectively oxidized to form a tunnel barrier oxide layer sandwiched between two epitaxial or textured ferromagnetic layers.

A typical first step in the fabrication of the MTJs is the growth of a ferromagnetic layer on an underlying substrate. If an epitaxial ferromagnetic layer is desired, both the underlying substrate and the ferromagnetic material of the ferromagnetic layer should be selected such that the lattice match between the substrate and the ferromagnetic layer is close enough to permit epitaxial growth. Optionally, the underlying substrate may be coated with an epitaxial buffer layer in order to alleviate the effects of any lattice mismatch between the two layers and to promote epitaxial growth. The first ferromagnetic layer having texture, preferably strong texture, or epitaxial structure can be grown on this buffer layer. Epitaxial growth may be achieved by a variety of techniques, many of which are well known in the art. Suitable growth techniques include, but are not limited to, molecular beam epitaxy (MBE) and magnetron sputtering. Suitable DC magnetron sputtering methods for growing an epitaxial Ni—Fe alloy layer on a silicon substrate with a buffer layer composed of silver and copper are described by Yu et al. in Appl. Phys. Lett., 82, 4735-4737 (2003), the entire disclosure of which is incorporated herein by reference. Textured growth may also be achieved by a variety of techniques, including, but not limited to, molecular beam epitaxy (MBE), and magnetron sputtering.

Once the first ferromagnetic layer has been grown over the substrate, a barrier precursor layer is grown on the first ferromagnetic layer. The barrier precursor layer may be composed of a metal, a metal alloy, or a semiconductor. The metal, metal alloy, or semiconductor may be selected such that the lattice match between the metal, metal alloy, or semiconductor and the ferromagnetic material allows for epitaxial or textured growth. Generally, epitaxial growth is possible where the lattice mismatch between the two materials is no more than about 15 percent. However, in cases where epitaxial or textured growth on the ferromagnetic layer is disfavored due to a lattice mismatch, epitaxial or textured growth may still be continued, provided the barrier precursor layer is kept sufficiently thin. Typically, a precursor layer thickness of less than or equal to about one nanometer(nm) is sufficiently thin to allow for the continued epitaxial or textured growth of the multi-layered structure. Thus, by using a sufficiently thin barrier precursor layer, the present methods may be used with almost any barrier precursor materials. One exemplary method for growing an epitaxial aluminum layer on an epitaxial Ni—Fe alloy layer is described by Yu et al. in Appl. Phys. Lett., 82, 4735-4737 (2003).

Once the tunnel barrier precursor layer is in place, a second ferromagnetic layer is grown or deposited over the tunnel barrier precursor layer. In some embodiments, this second ferromagnetic layer is grown epitaxially or with texture with respect to the substrate. When the first and second ferromagnetic layers are both epitaxial, the resulting structure is a fully epitaxial structure that includes a tunnel barrier precursor layer sandwiched between two ferromagnetic layers. The first and second ferromagnetic layers may be made of the same or different ferromagnetic materials.

The next step in the process is to selectively oxidize the tunnel barrier precursor layer to provide a tunnel barrier oxide layer. Selective oxidation of the tunnel barrier precursor layer may be accomplished by taking advantage of the ability to carefully control the $O_2$ partial pressure ($pO_2$) in an oxidizing gas by employing an oxidizing gas mixture of a first gas and second gas, where the ratio of the partial pressure of the first gas to the partial pressure of the second gas may be adjusted to provide a desired oxygen partial pressure. Examples of oxidizing gas mixtures that may be used in accordance with the methods include mixtures of $O_2$ and $CO_2$ and mixtures of $H_2$ and $H_2O$. Using these methods, it is possible to oxidize the barrier precursor layer without altering the epitaxial or textured structure of the ferromagnetic layer, although the resulting tunnel barrier oxide will likely have an amorphous, or partially amorphous structure.

In one typical embodiment of the methods provided herein, an MTJ is made by providing a multi-layered structure that includes a tunnel barrier precursor layer sandwiched between two ferromagnetic epitaxial or textured layers and exposing the structure to an oxidizing gas containing $O_2$ and at least two additional gases under oxidizing conditions that promote the formation of a tunnel barrier oxide but not the formation of oxides of the ferromagnetic elements in the ferromagnetic layers. The at least two additional gases are characterized in that the ratio of the two gases in the oxidizing gas mixture may be used to control the level of $O_2$ present in the oxidizing gas. Oxidizing gas mixtures containing CO and $CO_2$ or $H_2$ or $H_2O$ are examples of suitable oxidizing gas mixtures. By controlling the ratio of $pCO$ to $pCO_2$ or the ratio of $pH_2$ to $pH_2O$ in the oxidizing gas, it is possible to selectively and completely oxidize the barrier precursor layer without oxidizing the adjacent epitaxial ferromagnetic layers.

The conditions under which the tunnel barrier precursor layer is oxidized to provide the tunnel barrier oxide layer should be selected such that the layer is selectively and completely oxidized while minimizing or avoiding the oxidation of the adjacent ferromagnetic layers. In preferred embodiments, the conditions are selected to completely avoid any oxidation of the adjacent ferromagnetic materials. Generally, this will involve the use of a very low $O_2$ partial pressure in the oxidizing gas. Specifically, the $O_2$ partial pressure is desirably low enough that oxidation of the barrier precursor layer is thermodynamically favored while oxidation of the ferromagnetic layers is not. As one of skill in the art would understand, the maximum desirable $O_2$ partial pressure in the oxidizing gas will depend both on the nature of the ferromagnetic materials and the tunnel barrier material and on the oxidation temperature. However, in some instances the methods provided herein carry out the oxidation to form the tunnel barrier oxide at $O_2$ partial pressures of no more than about $1 \times 10^{-20}$ atmospheres (atm). This includes embodiments where the oxidation takes place using $O_2$ partial pressures of no more than about $1 \times 10^{-30}$ atm, further includes embodiments where the oxidation takes place using $O_2$ partial pressures of no more than about $10^{-40}$ atm, further includes embodiments where the oxidation takes place using $O_2$ partial pressures of no more than about $10^{-50}$ atm, further includes embodiments where the oxidation takes place using $O_2$ partial pressures of no more than about $10^{-60}$ atm, further includes embodiments where the oxidation takes place using $O_2$ partial pressures of no more than about $10^{-70}$, further includes embodiments where the oxidation takes place using $O_2$ partial pressures of no more than about $10^{-80}$ atm, and still further includes embodiments where the oxidation takes place using $O_2$ partial pressures of no more than about $10^{-100}$ atm.

These very low partial pressures of oxygen may not be practically achieved and controlled using air or pure $O_2$ as an oxidation gas. Instead, conventional approaches using such gases rely on kinetic control of the oxidation process under considerably higher $O_2$ partial pressures. These approaches have met with limited success, typically resulting in significant oxidation of adjacent ferromagnetic layers. Such low $O_2$ partial pressures may be readily achieved and controlled using an oxidizing gas containing at least two gases in addition to $O_2$ wherein the level of $O_2$ in the mixture depends on the equilibrium between the at least two gases. In such systems, the ratio of the at least two other two gases present in the mixture may be used to adjust and control the level of $O_2$ present in the oxidizing gas. This relationship may be expressed using the equilibrium equation for the gases in the mixture. For example, an equilibrium reaction for a mixture containing $O_2$, a first gas ("A") and a second gas ("B"), may be expressed as: $nA+mO_2=qB$, where n, m and q represent the appropriate coefficients in the balanced equation. The equilibrium expression for the reaction is: $K=pB^q/(pA^n \times pO_2^m)$, where K is a constant at a given temperature. Thus, the relationship between $pO_2$ and the ratio $pB:pA$ is: $pO_2=(pB^q/(K \times pA^n))^{1/m}$. Thus, by way of illustration, an oxidizing gas containing a mixture of CO and $CO_2$ may be represented by the equilibrium reaction $2CO+O_2=2CO_2$, where the partial pressure of $O_2$ in the mixture may be adjusted according to the equation: $pO_2=pCO_2^2/(K \times pCO^2)$. Alternatively, an oxidizing gas containing a mixture of $H_2$ and $H_2O$ may be represented by the equilibrium reaction $2H_2+O_2=2H_2O$, where the partial pressure of $O_2$ in the mixture may be adjusted according to the equation: $pO_2=pH_2O^2/(K \times H_2^2)$.

The oxidation of the tunnel barrier precursor layer to provide a tunnel barrier oxide layer is desirably carried out at elevated oxidation temperatures, elevated oxidation pressures or a combination of elevated oxidation temperatures and pressures. Elevated temperatures may be used to speed up the oxidation kinetics. Although the oxidation of the tunnel barrier layer may be carried out at room temperature (e.g. about 20 to 25° C.), in many instances it may be desirable to use elevated oxidation temperatures in order to reduce the necessary oxidation time. For example, in some embodiments of the methods, oxidation may be carried out at a temperature of at least about 50° C. This includes embodiments where the oxidation is carried out at a temperature of at least about 100°

C., also includes embodiments where the oxidation is carried out at a temperature of at least about 200° C., further includes embodiments where oxidation is carried out at a temperature of at least 300° C., even further includes embodiments where the oxidation is carried out at a temperature of at least 400° C., and still further includes embodiments where the oxidation is carried out at a temperature of at least about 500° C. Generally, the oxidation temperature should be selected such that it is low enough to avoid the onset of reactions and interdiffusions between the elements in the tunnel barrier layer and the ferromagnetic material in the ferromagnetic layers. Thus, for example, if the ferromagnetic layers are made from a Co-containing material (e.g. a Co—Fe alloy), and Al is used as the metal in the tunnel barrier layer, the oxidation temperature is desirably no more than about 500° C. in order to avoid reactions and/or interdiffusion between Al atoms in the tunnel barrier layer and Co atoms in the ferromagnetic layer.

Elevated oxidation gas pressures may also be used to speed up the oxidation kinetics. For example, in some embodiments of the methods provided herein, the total pressure of the oxidizing gas (e.g. the total pressure of $CO$, $CO_2$ and $O_2$ or the total pressure of $H_2$, $H_2O$ and $O_2$) to which the metal or semiconductor layer is exposed will be at least about 1 Torr. This includes embodiments where the total pressure of the oxidizing gas is at least about 200 Torr, further includes embodiments where the total pressure of the oxidizing gas is at least about 300 Torr, still further includes embodiments where the total pressure of the oxidizing gas is at least about 400 Torr and even further includes embodiments where the total pressure of the oxidizing gas is at least about 500 Torr. In order to minimize the time required for the complete oxidation of the tunnel barrier layer, it may be desirable to use a combination of elevated temperatures and pressures.

The time required for the complete oxidation of the tunnel barrier layer in the MTJ will depend, at least in part, on the oxidation temperature and pressure, on the nature and thickness of the tunnel barrier precursor layer, and on the thickness of the second-ferromagnetic layer. However, in some embodiments of the methods, a completely oxidized tunnel barrier layer may be produced from a metal or semiconductor layer in no more than about eight hours. This includes embodiments where the tunnel barrier layer is completely oxidized in less than about five hours, further includes embodiments where the tunnel barrier layer is completely oxidized in less than about three hours, still further includes embodiments where the tunnel barrier layer is completely oxidized in less than about an hour and even further includes embodiments where the tunnel barrier layer is oxidized in less than about thirty minutes.

Figure 2:
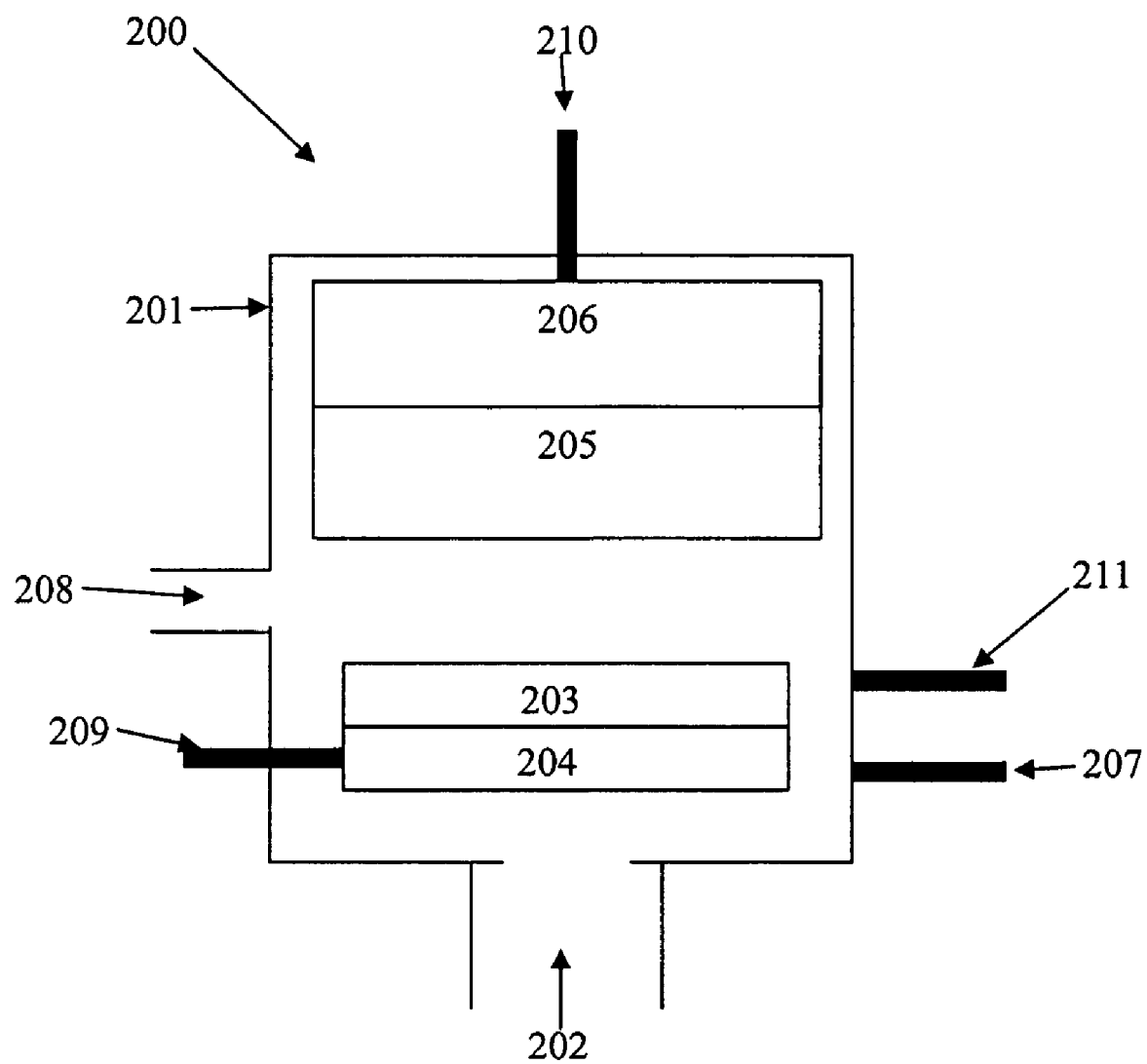
FIG. 2 is a schematic cross-sectional diagram of an apparatus that may be used to fabricate a magnetic tunnel junction in accordance with the present invention.

The ferromagnetic materials and the tunnel barrier precursor materials may be grown on or deposited over their respective underlying layers or substrates using a variety of deposition techniques, many of which are well known. Such techniques include, but are not limited to, molecular beam epitaxy, sputter deposition and evaporative deposition. FIG. 2 is a schematic diagram of an apparatus that may be used to deposit the various layers in the MTJ. The apparatus 200 includes an ultrahigh vacuum chamber 201 in fluid communication through a vacuum port 202 with one or more vacuum pumps (not shown). The vacuum chamber 201 houses a substrate 203 on which the various layers of the MTJ will be grown. The substrate 203 may be mounted over a heater 204 connected to a power source 209. A target material 205 (e.g., a tunnel barrier precursor target or a ferromagtic target) is deposited over the substrate 203. The target material is in electrical contact with a thin film deposition source 206. As shown in FIG. 2, the deposition source 206 may be a DC magnetron sputtering source connected to a power input 210 and adapted to apply a negative potential to the target material 205. A plasma precursor gas, such as argon, is introduced into the chamber 201 through a plasma precursor gas inlet port 211 and a sputter plasma is ignited in the chamber. After a first ferromagnetic layer, a tunnel barrier precursor layer and a second, overlying ferromagnetic layer have been deposited, an oxidizing gas is introduced into the chamber 201 through an oxidizing gas inlet port 207 and the structure is exposed to the oxidizing gas for a time sufficient to selectively oxidize the tunnel barrier precursor. The pressure in the chamber may be monitored using an appropriate pressure gauge mounted to a gauge mount 208. Other suitable methods and apparatus for depositing metal and ferromagnetic thin films are described in Kottler et al., *J. App. Phys.*, 89, 3301-3306 (2001) and Moordera et al., *Appl. Phys. Lett.*, 70, 3050-3052 (1997), the entire disclosures of which are incorporated herein by reference.

The selection of an appropriate substrate will depend at least in part on the nature of the ferromagnetic materials and the tunnel barrier oxides to be used in the MTJ structure. Generally, the substrate should be selected such that it permits epitaxial or textured growth of a ferromagnetic material with or without an intervening buffer layer. Silicon is a preferred substrate because it allows for the use of well known silicon processing technologies and results in a structure having broad industrial applicability.

Prior to the growth of the first ferromagnetic layer, a buffer layer may be grown on the substrate. This buffer layer may be used to lessen the effects of any lattice mismatch between the substrate and the ferromagnetic layer. Tantalum is one example of a suitable buffer layer material that may be used to induce textured structure in ferromagnetic materials. In some instances, the buffer layer will actually include two strata. For example, a buffer layer composed of a first stratum of silver underlying a second stratum of copper may be used on a silicon substrate. The buffer layer will generally be relatively thin. For example, in some embodiments the buffer layer will be no more than about 200 nm thick. This includes embodiments where the buffer layer is no more than about 100 nm thick.

The ferromagnetic materials used in the first and second ferromagnetic layers may be the same or different. A wide selection of suitable ferromagnetic materials is available because many common ferromagnetic materials have very similar lattice constants. The ferromagnetic materials used to provide the ferromagnetic layers should be selected to provide a thermodynamically stable interface between the ferromagnetic layers and the tunnel barrier oxide in order to minimize or eliminate reactions between ferromagnetic materials and the tunnel barrier oxides. This generally means that the materials should be selected such that the free energy for the production of tunnel barrier oxides is less than the free energy for production of oxides of the ferromagnetic elements. Suitable ferromagnetic materials for use as the ferromagnetic layers in the MTJs include iron, cobalt, nickel, some rare earth metals and their alloys. Specific examples of suitable metal alloys for use as ferromagnetic materials include, but are not limited to, alloys of cobalt and iron (e.g., $Co_{0.9}Fe_{0.1}$, or $Co_{0.5}Fe_{0.5}$, and more generally $Co_xFe_{1-x}$) and alloys of nickel and iron (e.g., $Ni_{0.8}Fe_{0.2}$ and more generally $Ni_xFe_{1-x}$). The ferromagnetic layers are typically quite thin. For example, in some MTJs the thickness of the ferromagnetic layers may be no more than about 20 nm. This includes embodiments wherein the ferromagnetic layers each have a thickness of no more than about 10 nm, further includes embodiments where the ferromagnetic layers each have a thickness of about 5 nm, and still further includes embodiments where ferromagnetic layers have a thickness of no more than about 6 nm. During fabrication of the MTJs, it may be advantageous to apply the second ferromagnetic layer in two steps. In a first step, a thin layer (e.g., no more than about 3 nm) is grown on the barrier precursor layer. The thinness of this layer facilitates oxidation of the underlying tunnel barrier precursor layer through the thin layer of ferromagnetic material. After the oxidation of the tunnel barrier precursor layer, epitaxial or textured growth of the second ferromagnetic layer may be continued, if a thicker ferromagnetic layer is desired.

The tunnel barrier oxide layers in the MTJs are composed of high quality oxide layers desirably characterized by a uniform concentration of oxygen throughout the tunnel barrier layer. The materials selected to provide the tunnel barrier oxides are desirably characterized as being good oxide formers, (e.g. metal oxides or semiconductor oxides having large negative enthalpies of formation). The selected materials are also desirably characterized by low band gaps of their oxides, and therefore low junction resistances, which lead to improved sensitivity of the MTJs into which they are incorporated. Suitable metals for use in the production of metal oxide tunnel barrier layers in accordance with the present methods include transition metals, rare earth metals (lanthanides), actinides, alkali metals and alkaline earth metals. Specific examples of metal and semiconductor materials that may be oxidized to produce the oxide tunnel barrier layers include, but are not limited to, aluminum (Al), yttrium (Y), tantalum (Ta), hafnium (Hf), zirconium (Zr), gallium (Ga), chromium (Cr), manganese (Mn), silicon (Si), titanium (Ti), magnesium (Mg), niobium (Nb) and calcium (Ca), and alloys thereof. Aluminum oxide ($Al_2O_3$) is perhaps the best known material for use as a tunnel barrier layer in MTJs and is particularly well-suited as a tunnel barrier layer in accordance with the present methods.

The tunnel barrier oxide layer optionally may be doped with magnetic particles. This doping provides an increase in magnetoresistance and improved signal to noise ratio. Suitable doping particles include cobalt, iron and nickel particles.

The tunnel barrier oxide layers will generally be quite thin in order to provide low RA (i.e., resistance x area). Typically, the tunnel barrier layers will have a thickness of no more than about 5 nanometers (nm). This includes tunnel barrier layers having a thickness of no more than about 2 nm, further includes tunnel barrier layers having a thickness of no more than about 1 nm and still further includes tunnel barrier layers having a thickness of no more than about 5 angstroms (Å).

The MTJs may include an antiferromagnetic layer deposited adjacent one of the ferromagnetic layers. The antiferromagnetic layer, which serves as a pinning layer in the MTJs provided herein, may be selected from a variety of known antiferromagnetic materials that have conventionally been used for this purpose. Such antiferromagnetic materials include, but are not limited to, Ni—Mn alloys, Fe—Mn alloys, Ir—Mn alloys and Pt—Mn alloys.

The MTJs provided in accordance with the present methods are well-suited for use in a variety of devices, including magnetic sensor and storage devices. For example, the MTJs may be used as magnetic field sensors (e.g., magnetoresistive read heads) for sensing the magnetic field signals from a rotating magnetic disk in a magnetic disk drive of a computer, as described in U.S. Pat. No. 5,729,410, the entire disclosure of which is incorporated herein by reference. The MTJs are also well suited for use as a memory cell in a nonvolatile magnetic random access memory (MRAM) array, as described in U.S. Pat. No. 5,640,343, the entire disclosure of which is incorporated herein by reference. A typical MRAM made from the MTJs provided herein includes an array of individual magnetic memory cells, each comprising an MTJ and a diode electrically connected in series.

Figure 3:
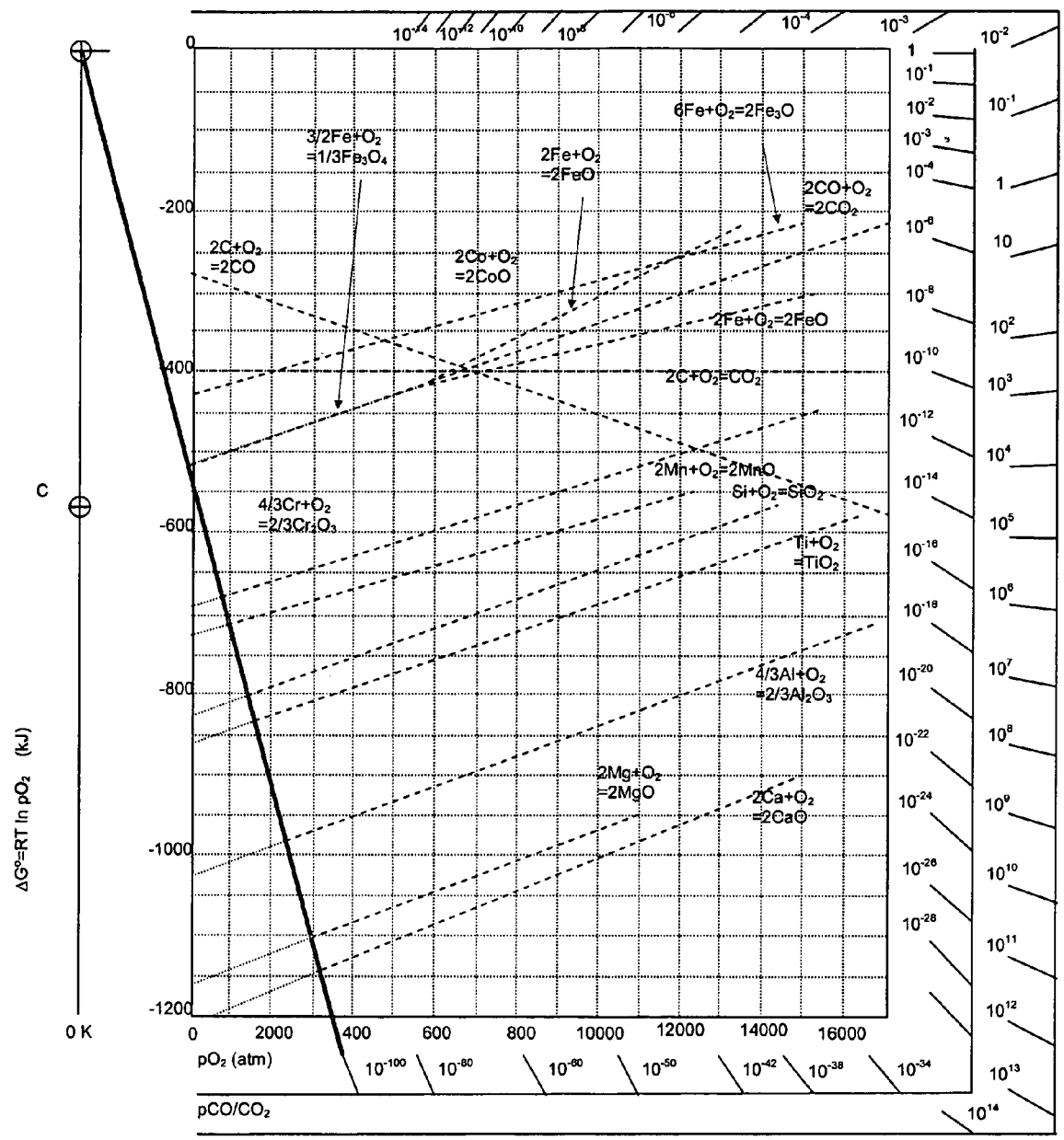
FIG. 3 is an Ellingham diagram for various metal oxides.

The following is a description of a method for calculating a desirable $pO_2$ for the production of an MTJ composed of an $Al_2O_3$ tunnel barrier layer disposed between two CoFe ferromagnetic layers. This description, which is provided to illustrate the methods and to assist one skilled in the art in using the same, should not be considered to limit the invention. These calculations, and those that follow, are based on an exemplary MTJ having a $Co_{0.9}Fe_{0.1}$ alloy as the ferromagnetic layer. These calculations are based on the Ellingham diagram shown in FIG. 3. The Ellingham diagram is a type of phase diagram that plots the oxidation potential of several metal-metal oxide systems vs. temperature. Note that the slopes of all of the metal reactions in the diagram of FIG. 3 are positive and are of roughly the same magnitude. The slope is related to the entropy change ($\Delta S$) in the Gibbs free energy equation:

$$\Delta G = \Delta H - T\Delta S.$$

The metal-metal oxide reactions involve the incarceration of a high entropy gaseous species, $O_2$, in a lower entropy solid phase (note the negative sign in the equation which makes the slopes positive). Therefore, as temperature increases and the entropy contribution becomes larger, the oxidation reactions generally become less stable and require a higher $O_2$ partial pressure for stability.

The driving force for oxidation can be roughly calculated from the Ellingham diagram in the following manor. Lines of constant $O_2$ partial pressure are drawn diagonally from the origin to the desired position on the $O_2$ axis. For example, the grey line in FIG. 3 represents an $O_2$ partial pressure of $10^{-100}$ atm. At this partial pressure (for the oxidation reactions of interest), the dotted lines indicate regions where the oxidation reaction is stable, while the dashed lines indicate regions were the reduction of the oxide to pure metal is stable. At any given temperature, the length of a vertical line drawn from the grey line to the desired reaction yields the driving force for the oxidation/reduction reactions. Therefore, at an $O_2$ partial pressure of $10^{-100}$ atm and a temperature of 50° C. (based on the Ellingham diagram an $O_2$ partial pressure of $10^{-80}$ atm could also be used at 50° C.), there is a significant driving force to oxidize Cr, Mn, Si, Al, Mg and Ca, while Co, Fe and Ni will not oxidize.

In practical applications, an $O_2$ partial pressure of $10^{-100}$ atm is not attainable by introducing a known amount of $O_2$ into a high purity carrier gas such as argon (Ar). However, the $O_2$ partial pressure may be readily controlled by introducing an oxidizing gas having a known ratio of $pCO:pCO_2$.

Once a desirable $O_2$ partial pressure has been calculated or estimated, an appropriate $pCO:pCO_2$ ratio for the production of a MTJ, may be determined. Here again, we use an exemplary $CoFe/Al_2O_3/CoFe$ MTJ as an illustration. As noted above, to avoid oxidizing Co at 298 K, the partial pressure of $O_2$ will have to be very low. For this illustration an $O_2$ partial pressure lower than $10^{-80}$ atm is used. This is extremely difficult to obtain even with high purity process gases. However, by using an appropriate $pCO:pCO_2$ ratio, this partial pressure of $O_2$ is attainable. An appropriate $pCO:pCO_2$ ratio may be calculated based on the thermodynamics of the equilibrium reaction $2CO+O_2=2CO_2$ (Reaction I), and the energies of formation ($\Delta G°_f$) from pure elements at 298 K of $O_2$, $CO_2$ and CO (i.e. $\Delta G°_{f,O2}=0$ (by definition); $\Delta G°_{f,CO2}=-3.946$ E5 J/mol; and $\Delta G°_{f,CO}=-1.379$ E5 J/mol, where "E"

indicates that the number that follows represents an exponent, i.e. "E5"="×10⁵"). The equilibrium equation for Reaction I is:

$$\Delta G°_{rxn\,I} = 2\Delta G°_{f,CO2} - \Delta G°_{f,O2} - 2\Delta G°_{f,CO}; \text{ also}$$

$\Delta G°_{rxn\,I} = -RT\ln(K) = -5.134\,E5$ J/mol, where R is the gas constant, T is temperature and K is the equilibrium constant which equals:

$$K = \exp\left(\frac{-\Delta G°_{rxn}}{R\cdot T}\right) = \left(\frac{p^2_{CO2}}{p^2_{CO}\cdot p_{O2}}\right) = 8.937\,E89,$$

wherein p represents a partial pressure.

With this expression for K in terms of p, the required pCO:pCO₂ ratio needed to maintain any desired O₂ partial pressure may be determined. Therefore, for a $pO_2 = 10^{-80}$ atm, the pCO:pCO₂ needed to provide this partial pressure is:

$$\frac{p_{CO}}{p_{CO2}} = (1/(p_{O2}\cdot K))^{1/2} = 1.1\,E-5 \text{ or higher.}$$

Thus, the calculations indicate that in order to avoid oxidation of Co using a pO₂ of $10^{-80}$ atm at 50° C., the pCO:pCO₂ ratio needs to be greater than 1.1×10⁻⁵. This is easily attainable using commercially available process gases.

It should be noted, however, that because the Ellingham diagram is based on pure elemental oxidation it provides only a guide for estimating the minimum desirable pCO:pCO₂ ratio in the oxidizing gas. For ferromagnetic layers composed of alloys, this estimate may be too low and the user may benefit from choosing a ratio that is several orders of magnitude higher. Fortunately, if a more accurate estimate is needed or desired, it may be calculated using known thermodynamic data, as described below.

A refined set of calculations for determining an appropriate minimum pCO:pCO₂ ratio for an MTJ (e.g. a CoFe/Al₂O₃/CoFe MTJ) follows. One main consideration regarding an alloy system, is that the activities of the individual atom types in the alloy are not unity. Therefore, if possible, every likely oxidation reaction should be calculated with respect to the elemental activity in the alloy. The proper pCO:pCO₂ ratio is then chosen to forbid the formation of the most stable ferromagnetic layer oxide while still providing significant driving force to oxidize the tunnel barrier layer. In accordance with the calculations outlined below (i.e., for Reactions II-VI) for the Co—Fe—Al system considered here, a pCO:pCO₂ ratio above 0.04 is needed to avoid oxidation of the ferromagnetic layer while it is practically impossible to avoid the oxidation of Al using a pCO:pCO₂ ratio at 25° C.

The minimum desirable pCO:pCO₂ ratio may be determined by calculating the minimum desirable pCO:pCO₂ ratio needed to forbid the formation of each possible ferromagnetic layer oxide. These calculations are outlined briefly for a CoFe ferromagnetic layer below.

Reaction II: Fe+CO₂=FeO+CO @ 298 K

Energies of formation from pure elements at 298 K: $\Delta G°_{f,Fe}=0$ (by definition); $\Delta G°_{f,FeO}=-2.456\,E5$ J/mol; $\Delta G°_{f,CO2}=-3.946\,E5$ J/mol; and $\Delta G°_{f,CO}=-1.379\,E5$ J/mol. The equilibrium equation for Reaction II is:

$$\Delta G°_{rxn\,II} = \Delta G°_{f,CO} + \Delta G°_{f,FeO} - \Delta G°_{f,Fe} - \Delta G°_{f,CO2}; \text{ also}$$

$\Delta G°_{rxn\,II} = -RT\ln(K) = 1.114\,E4$ J/mol, where R is the gas constant, T is temperature and K is the equilibrium constant which equals:

$$K = \exp\left(\frac{-\Delta G°_{rxn\,II}}{R\cdot T}\right) = \left(\frac{p_{CO}\cdot a_{FeO}}{p_{CO2}\cdot a_{Fe}}\right) = 1.118\,E-2,$$

where a represents activity.

For gaseous species, activity is equal to partial pressure. Here, the iron is assumed to have a concentration of 10 at. % in Co. Thus, $$\frac{p_{CO}}{p_{CO2}} = \frac{a_{Fe}}{a_{FeO}}K = 1.2\,E-3$$

or higher to avoid oxidation of Fe.

Reaction III: 2Fe+3CO₂=Fe₂O₃+3CO @ 298 K

Energies of formation from pure elements at 298 K: $\Delta G°_{f,Fe}=0$ (by definition); $\Delta G°_{f,Fe2O3}=-2.093\,E6$ J/mol; $\Delta G°_{f,CO2}=-3.946\,E5$ J/mol; and $\Delta G°_{f,CO}=-1.379\,E5$ J/mol. The equilibrium equation for Reaction III is:

$$\Delta G°_{rxn\,III} = 3\Delta G°_{f,CO} + \Delta G°_{f,Fe2O3} - 2\Delta G°_{f,Fe} - 3\Delta G°_{f,CO2}; \text{ also}$$

$\Delta G°_{rxn\,III} = -RT\ln(K) = 2.637\,E4$ J/mol, where R is the gas constant, T is temperature and K is the equilibrium constant which equals:

$$K = \exp\left(\frac{-\Delta G°_{rxn\,III}}{R\cdot T}\right) = \left(\frac{p^3_{CO}\cdot a_{Fe2O3}}{p^3_{CO2}\cdot a^2_{Fe}}\right) = 2.397\,E-5,$$

where a represents activity.

Here, the iron is assumed to have a concentration of 10 at. % in Co. Thus, $$\frac{p_{CO}}{p_{CO2}} = \left(\frac{a^2_{Fe}}{a_{Fe2O3}}K\right)^{1/3} = 6.2\,E-3$$

or higher to avoid oxidation of Fe.

Reaction IV: 3Fe+4CO₂=Fe₃O₄+4CO @ 298 K

Energies of formation from pure elements at 298 K: $\Delta G°_{f,Fe}=0$ (by definition); $\Delta G°_{f,Fe3O4}=-1.012\,E6$ J/mol; $\Delta G°_{f,CO2}=-3.946\,E5$ J/Mol; and $\Delta G°_{f,CO}=-1.379\,E5$ J/mol. The equilibrium equation for Reaction IV is:

$$\Delta G°_{rxn\,IV} = 4\Delta G°_{f,CO} + \Delta G°_{f,Fe3O4} - 3\Delta G°_{f,Fe} - 4\Delta G°_{f,CO2}; \text{ also}$$

$\Delta G°_{rxn\,IV} = -RT\ln(K) = 1.503\,E4$ J/mol, where R is the gas constant, T is temperature and K is the equilibrium constant which equals:

$$K = \exp\left(\frac{-\Delta G^\circ_{rxn\,IV}}{R\cdot T}\right) = \left(\frac{\rho^4_{CO}\cdot a_{Fe3O4}}{\rho^4_{CO2}\cdot a^3_{Fe}}\right) = 2.328\,E-3,$$

where a represents activity.

Here, the iron is assumed to have a concentration of 10 at. % in Co. Thus, $$\frac{\rho_{CO}}{\rho_{CO2}} = \left(\frac{a^3_{Fe}}{a_{Fe3O4}}K\right)^{1/4} = 3.9\,E-2$$

or higher to avoid oxidation of Fe.

Reaction V: $Co+CO_2=CoO+CO$ @ 298 K

Energies of formation from pure elements at 298 K: $\Delta G^\circ_{f,Co}=0$ (by definition); $\Delta G^\circ_{f,CoO}=-2.129\,E5$ J/mol; $\Delta G^\circ_{f,CO2}=-3.946\,E5$ J/mol; and $\Delta G^\circ_{f,CO}=-1.379\,E5$ J/mol. The equilibrium equation for Reaction V is:

$\Delta G^\circ_{rxn\,V} = \Delta G^\circ_{f,CO} + \Delta G^\circ_{f,CoO} - \Delta G^\circ_{f,Co} - \Delta G^\circ_{f,CO2}$; also $\Delta G^\circ_{rxn\,V} = -RT\,\ln(K) = 4.376\,E4$ J/mol, where R is the gas constant, T is temperature and K is the equilibrium constant which equals:

$$K = \exp\left(\frac{-\Delta G^\circ_{rxnV}}{R\cdot T}\right) = \left(\frac{\rho_{CO}\cdot a_{CoO}}{\rho_{CO2}\cdot a_{Co}}\right) = 2.153\,E-8,$$

wherein a represents activity.

Here, the Co is assumed to have a concentration of 90 at. % in Fe. Thus, $$\frac{\rho_{CO}}{\rho_{CO2}} = \frac{a_{Co}}{a_{CoO}}K = 1.9\,E-8$$

or higher to avoid oxidation of Co.

Reaction VI: $3Co+4CO_2=Co_3O_4+4CO$ @ 298 K

Energies of formation from pure elements at 298 K: $\Delta G^\circ_{f,Co}=0$ (by definition); $\Delta G^\circ_{f,Co3O4}=-8.664\,E5$ J/mol; $\Delta G^\circ_{f,CO2}=-3.946\,E5$ J/mol; and $\Delta G^\circ_{f,CO}=-1.379\,E5$ J/mol. The equilibrium equation for Reaction VI is:

$\Delta G^\circ_{rxn\,VI} = 4\Delta G^\circ_{f,CO} + \Delta G^\circ_{f,Co3O4} - 3\Delta G^\circ_{f,Co} - 4\Delta G^\circ_{f,CO2}$; also $\Delta G^\circ_{rxn\,VI} = -RT\,\ln(K) = 1.604\,E5$ J/mol, where R is the gas constant, T is temperature and K is the equilibrium constant which equals:

$$K = \exp\left(\frac{-\Delta G^\circ_{rxnVI}}{R\cdot T}\right) = \left(\frac{\rho^4_{CO}\cdot a_{Co3O4}}{\rho^4_{CO2}\cdot a^3_{Co}}\right) = 7.841\,E-29,$$

wherein a represents activity.

Here, the Co is assumed to have a concentration of 90 at. % in Fe. Thus, $$\frac{\rho_{CO}}{\rho_{CO2}} = \left(\frac{a^3_{Co}}{a_{Co3O4}}K\right)^{1/4} = 8.695\,E-8$$

or higher to avoid oxidation of Co.

It should be noted that these calculations and the Ellingham diagram (FIG. 3) do not provide information about reaction kinetics, only thermodynamic reaction stability. For example, Al and its alloys are generally considered to be oxidation resistant materials for structural applications even though the Ellingham diagram predicts a large driving force for oxidation under atmospheric conditions. The explanation for this apparent contradiction lies in the consideration of reaction kinetics. $Al_2O_3$ quickly forms on all exposed Al surfaces, but then abruptly stops. This happens because of the good lattice match between $Al_2O_3$ and Al; after the initial oxide forms, the only way for $O_2$ to reach the remaining Al is by diffusion, which is very slow at standard atmospheric conditions. Fortunately, for many TMR devices, the desired oxide layer thickness is on the order of 0.5 nm and the initial oxide formation may be enough to fully penetrate the layer. In addition, the reaction kinetics may be increased by oxidizing under elevated temperature and/or elevated pressure conditions Exemplary embodiments of the present methods for the production of MTJs having epitaxial ferromagnetic layers are provided in the following examples. These examples are presented to illustrate the methods and to assist one of ordinary skill and using the same. These examples are not intended in any way to otherwise limit the scope of the invention.

EXAMPLES

Example 1

Growth of a Magnetic Tunnel Junction on Silicon

This example describes the production of a magnetic tunnel junction composed of a yttrium oxide tunnel barrier layer between two epitaxial cobalt ferromagnetic layers on a silicon substrate. Epitaxial growth of the cobalt on silicon was assisted by a two-strata buffer layer composed of silver and copper. The buffer layer was deposited onto a silicon (111) substrate using DC magnetron sputtering in a high vacuum chamber. The DC magnetron sputtering was a two step process where a three nm thick silver stratus was first sputtered from a silver target onto the silicon substrate and a hundred nm thick copper stratus was subsequently sputtered from a copper target onto the silver stratus. Next, a first cobalt ferromagnetic layer having a thickness of approximately six nm was grown epitaxially on the buffer layer using DC magnetron sputtering from a cobalt target. An epitaxial yttrium tunnel barrier precursor layer having a thickness of approximately 0.8 nm was then sputtered onto the first ferromagnetic layer from a yttrium target using DC magnetron sputtering. A second epitaxial cobalt ferromagnetic layer having a thickness of two nm was then grown over the tunnel barrier precursor layer.

After the formation of this multi-layered epitaxial structure, the sputter plasma was turned off and the multi-layered structure was exposed to a gas containing a mixture of $H_2O$ and $H_2$ at a pressure of 500 Torr and a temperature of 200° C. for 60 minutes in order to selectively oxidize the tunnel barrier precursor layer.

The thickness of the second epitaxial cobalt ferromagnetic layer was increased post-oxidation to 50 nm via DC magnetron sputtering. Finally, a 50 nanometer thick silver capping layer was grown epitaxially over the second cobalt ferromagnetic layer by DC sputtering from a silver target. This capping layer could be used to further verify the epitaxial nature of the second ferromagnetic layer, as discussed below.

X-ray photoelectron spectroscopy (XPS) spectra were obtained for the MTJ. The spectra revealed that the yttrium tunnel barrier precursor layer was selectively oxidized, leaving the adjacent cobalt ferromagnetic layers unoxidized. X-ray diffraction (XRD) spectra were also obtained for the MTJ. These spectra showed that the silver and copper strata in the buffer layer, the cobalt ferromagnetic layers and the silver capping layer were all epitaxial with respect to the silicon substrate. Because both the first and second cobalt ferromagnetic layers contribute to the same XRD cobalt peaks more evidence is needed to establish that the second cobalt ferromagnetic layer also grows epitaxially. The silver capping layer was used as an indicator to show that the underlying cobalt ferromagnetic layer was, in fact, epitaxial. The fact that the silver capping layer showed epitaxial growth indicates that the second cobalt ferromagnetic layer, upon which the silver layer was grown, must also be an epitaxial layer.

Example 2

Growth of a Magnetic Tunnel Junction on Silicon—Comparative

This example provides a comparative example of a magnetic tunnel junction made from the same materials as the magnetic tunnel junction of Example 1, wherein oxidation of the tunnel barrier precursor layer was carried out prior to the growth of the second ferromagnetic layer. The process for growing the magnetic tunnel junction was the same as that described above for Example 1, with the exception that the yttrium tunnel barrier precursor layer was exposed to and selectively oxidized by the oxidizing gas mixture of $H_2$ and $H_2O$ prior to the growth of the second cobalt layer thereon.

Figure 4:
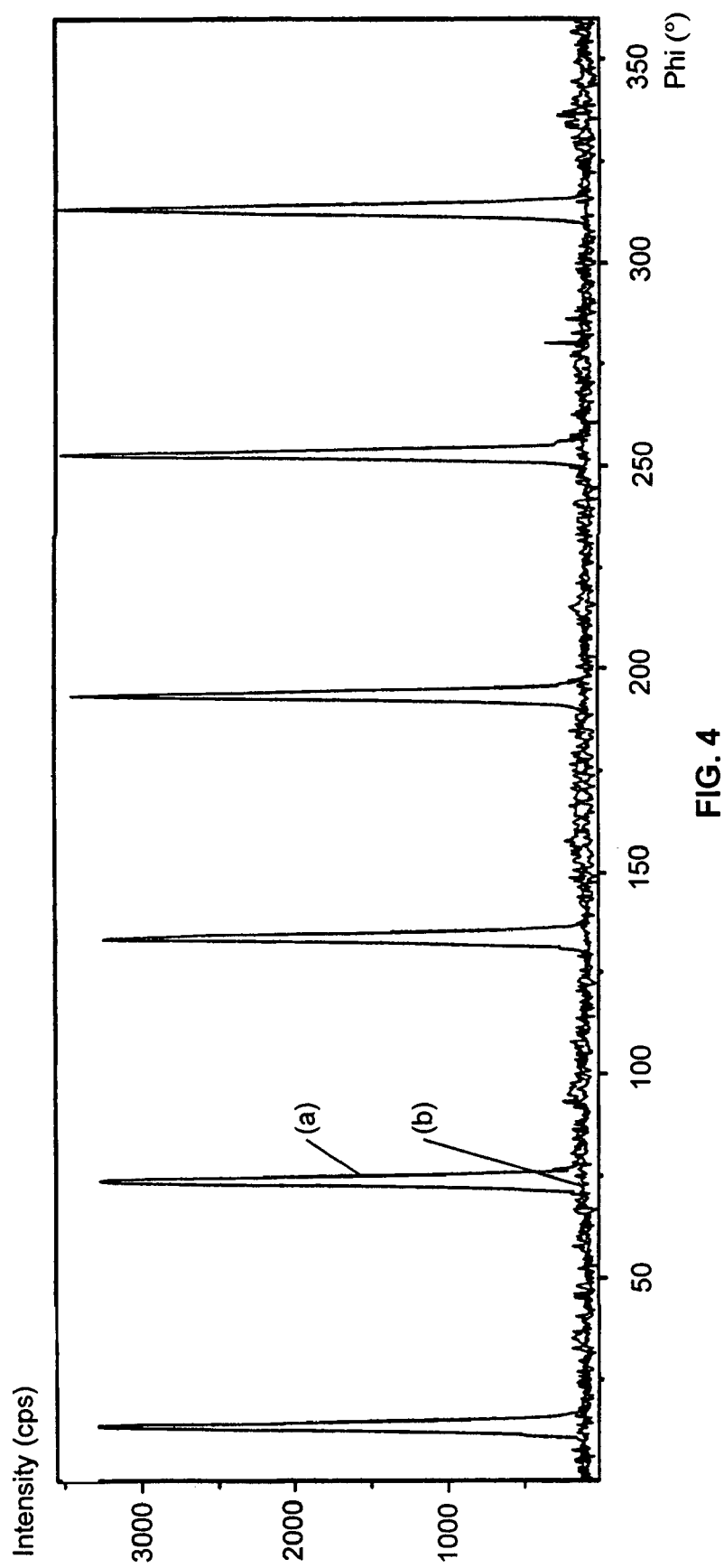
FIG. 4 shows a comparison of the x-ray diffraction $\phi$ scans for an MTJ having two epitaxial ferromagnetic layers (Example 1) and an MTJ having only a single epitaxial ferromagnetic layer (Example 2).

Again, X-ray photoelectron spectroscopy (XPS) spectra were obtained for the MTJ. The spectra revealed that the yttrium tunnel barrier precursor layer was selectively oxidized, leaving the adjacent cobalt ferromagnetic layer unoxidized. X-ray diffraction (XRD) spectra were also obtained for the MTJ. In contrast to the XRD spectra obtained for the MTJ of Example 1, the XRD spectra obtained for the MTJ of Example 2 revealed that the silver capping layer did not have an epitaxial structure with regard to the silicon substrate, indicating that the second cobalt ferromagnetic layer upon which the capping layer was grown also lacked epitaxial structure. A comparison of the XRD φ scans for the silver capping layer in the MTJs of Examples 1 and 2 is shown in FIG. 4. In this figure, the peaks in the scan corresponding to the MTJ of Example 1 (labeled "a") confirm epitaxial growth. Such peaks are absent from the spectra corresponding to the MTJ of Example 2 (labeled "b").

Example 3

Growth of a Magnetic Tunnel Junction on Silicon

This example describes the production of a magnetic tunnel junction composed of an aluminum oxide tunnel barrier layer between two epitaxial cobalt ferromagnetic layers on a silicon substrate. Epitaxial growth of the cobalt on silicon was assisted by a two-strata buffer layer composed of silver and copper. The buffer layer was deposited onto a silicon (111) substrate using the methods described above in Example 1. Next, a first cobalt ferromagnetic layer having a thickness of approximately 6 nm was grown epitaxially on the buffer layer using DC magnetron sputtering from a cobalt target. An epitaxial aluminum tunnel barrier precursor layer was then sputtered onto the first ferromagnetic layer from an aluminum target using DC magnetron sputtering. A second epitaxial cobalt ferromagnetic layer having a thickness of 2 nm was then grown over the tunnel barrier precursor layer.

After the formation of this multi-layered epitaxial structure, the sputter plasma was turned off and the multi-layered structure was exposed to a gas containing a mixture of $H_2O$ and $H_2$ at a pressure of 500 Torr and a temperature of 230° C. for 120 minutes in order to selectively oxidize the tunnel barrier precursor layer.

The thickness of the second epitaxial cobalt ferromagnetic layer was increased post-oxidation to 50 nm via DC magnetron sputtering. Finally, a 50 nanometer thick silver capping layer was grown epitaxially over the second cobalt ferromagnetic layer by DC sputtering from a silver target. X-ray photoelectron spectroscopy (XPS) data revealed that the aluminum tunnel barrier precursor layer was selectively oxidized, leaving the adjacent cobalt ferromagnetic layers unoxidized. X-ray diffraction (XRD) spectra showed that the silver and copper strata in the buffer layer, the cobalt ferromagnetic layers and the silver capping layer were all epitaxial with respect to the silicon substrate.

Example 4

Growth of a Magnetic Tunnel Junction on Silicon

This example describes the production of a magnetic tunnel junction composed of an aluminum oxide tunnel barrier layer between two epitaxial cobalt ferromagnetic layers on a silicon substrate. Epitaxial growth of the cobalt on silicon was assisted by a two-strata buffer layer composed of silver and copper and an antiferromagnetic pinning layer of FeMn was deposited on the copper stratum prior to the deposition of the first ferromagnetic cobalt layer. The buffer layer was deposited onto a silicon (111) substrate using the methods described above in Example 1. Next, the FeMn layer was grown on the copper stratum using DC magnetron sputtering from a $F_{50}Mn_{50}$ compound target. A first cobalt ferromagnetic layer having a thickness of approximately 6 nm was grown epitaxially on the pinning layer using DC magnetron sputtering from a cobalt target. The remaining layers for deposited using the same methods as described in Example 3, above.

X-ray photoelectron spectroscopy (XPS) data revealed that the aluminum tunnel barrier precursor layer was selectively oxidized, leaving the adjacent cobalt ferromagnetic layers unoxidized. X-ray diffraction (XRD) spectra showed that the silver and copper strata in the buffer layer, the cobalt ferromagnetic layers and the silver capping layer were all epitaxial with respect to the silicon substrate.

Example 5

Growth of a Magnetic Tunnel Junction on Silicon

This example describes the production of a magnetic tunnel junction composed of an aluminum oxide tunnel barrier layer between two epitaxial nickel ferromagnetic layers on a silicon substrate. Epitaxial growth of the nickel on silicon was assisted by a two-strata buffer layer composed of silver and copper. The buffer layer was deposited onto a silicon (111) substrate using the methods described above in Example 1. Next, a first nickel ferromagnetic layer having a thickness of approximately 6 nm was grown epitaxially on the buffer layer using DC magnetron sputtering from a nickel target. An epitaxial aluminum tunnel barrier precursor layer was then sputtered onto the first ferromagnetic layer from an aluminum target using DC magnetron sputtering. A second epitaxial nickel ferromagnetic layer having a thickness of 4 nm was then grown over the tunnel barrier precursor layer.

After the formation of this multi-layered epitaxial structure, the sputter plasma was turned off and the multi-layered structure was exposed to a gas containing a mixture of $H_2O$ and $H_2$ at a pressure of 500 Torr and a temperature of 230° C. for 120 minutes in order to selectively oxidize the tunnel barrier precursor layer.

The thickness of the second epitaxial nickel ferromagnetic layer was increased post-oxidation to 50 nm via DC magnetron sputtering. Finally, a 50 nanometer thick silver capping layer was grown epitaxially over the second nickel ferromagnetic layer by DC sputtering from a silver target. X-ray photoelectron spectroscopy (XPS) data revealed that the aluminum tunnel barrier precursor layer was selectively oxidized, leaving the adjacent nickel ferromagnetic layers unoxidized. X-ray diffraction (XRD) spectra showed that the silver and copper strata in the buffer layer, the nickel ferromagnetic layers and the silver capping layer were all epitaxial with respect to the silicon substrate.

Example 6

Growth of a Magnetic Tunnel Junction on Silicon

This example describes the production of a magnetic tunnel junction composed of an aluminum oxide tunnel barrier layer between two epitaxial $Ni_{81}Fe_{19}$ ferromagnetic layers on a silicon substrate. Epitaxial growth of the Ni—Fe on silicon was assisted by a two-strata buffer layer composed of silver and copper. The buffer layer was deposited onto a silicon (111) substrate using the methods described above in Example 1. Next, a first $Ni_{81}Fe_{19}$ ferromagnetic layer having a thickness of approximately 6 nm was grown epitaxially on the buffer layer using DC magnetron sputtering from a Ni target with Fe chips. An epitaxial aluminum tunnel barrier precursor layer was then sputtered onto the first ferromagnetic layer from an aluminum target using DC magnetron sputtering. A second epitaxial Ni—Fe ferromagnetic layer having a thickness of 4 nm was then grown over the tunnel barrier precursor layer.

After the formation of this multi-layered epitaxial structure, the sputter plasma was turned off and the multi-layered structure was exposed to a gas containing a mixture of $H_2O$ and $H_2$ at a pressure of 500 Torr and a temperature of 230° C. for 120 minutes in order to selectively oxidize the tunnel barrier precursor layer.

The thickness of the second epitaxial Ni—Fe ferromagnetic layer was increased post-oxidation to 50 nm via DC magnetron sputtering. Finally, a 50 nanometer thick silver capping layer was grown epitaxially over the second Ni—Fe ferromagnetic layer by DC sputtering from a silver target. X-ray photoelectron spectroscopy (XPS) data revealed that the aluminum tunnel barrier precursor layer was selectively oxidized, leaving the adjacent Ni—Fe ferromagnetic layers unoxidized. X-ray diffraction (XRD) spectra showed that the silver and copper strata in the buffer layer, the Ni—Fe ferromagnetic layers and the silver capping layer were all epitaxial with respect to the silicon substrate.

Example 7

Growth of a Magnetic Tunnel Junction on Silicon

Figure 5:
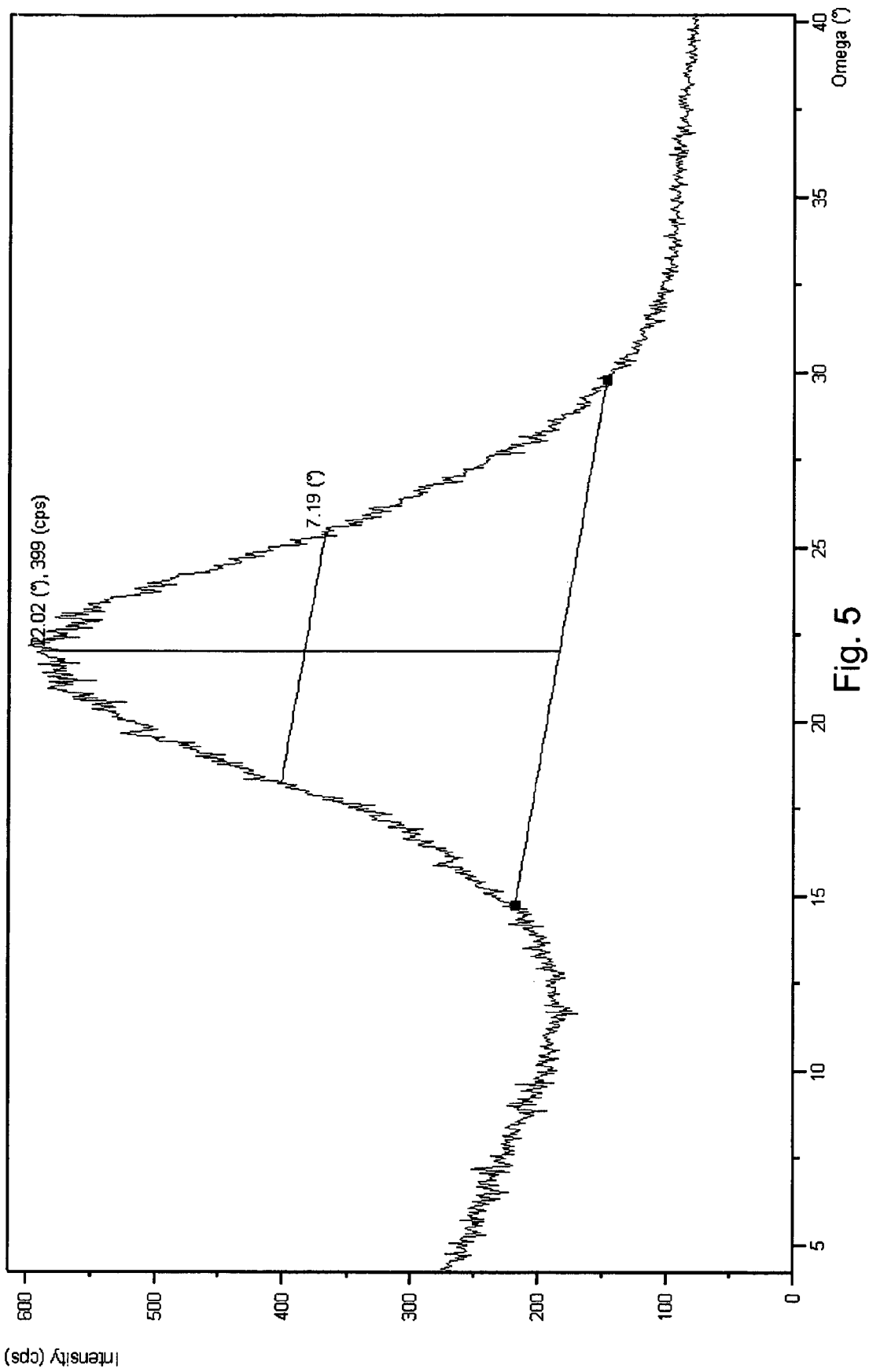
FIG. 5 shows the rocking curve for the cobalt ferromagnetic layer of Example 7.

This example describes the production of a magnetic tunnel junction composed of an aluminum oxide tunnel barrier layer between two textured cobalt ferromagnetic layers on a silicon substrate. Strong textured growth of the cobalt on silicon was assisted by a Ta buffer layer grown on the silicon with 465 nm thermal oxidized $SiO_2$ on top by DC magnetron sputtering from a Ta target. A first cobalt ferromagnetic layer having a thickness of approximately 6 nm was grown with strong texture on the pinning layer using DC magnetron sputtering from a cobalt target. The remaining layers were deposited using the same methods as described in Example 3, above. The rocking curve for the x-ray diffraction spectrum of the cobalt ferromagnetic layer is shown in FIG. 5. The FWHM of the curve is less than 8°, consistent with a strong texture. The setting for the x-ray diffraction analysis were as follows: wavelength used=Cu K-alpha1 (1.5405981 Å); scan axis=omega; scan range=4.2050-40.2050; step size=0.0400; time/step=6.00; scan mode=continuous; and scan speed=0.0067.

The invention has been described with reference to specific and illustrative embodiments. However it should be understood that many variations and modifications may be made while remaining within the scope of the following claims.

What is claimed is:

1. A magnetic tunnel junction comprising:
   (a) a silicon substrate;
   (b) a first ferromagnetic layer deposited on the silicon substrate;
   (c) a tunnel barrier oxide layer deposited on the first ferromagnetic layer; and
   (d) a second ferromagnetic layer deposited on the tunnel barrier oxide layer;
   wherein the first and second ferromagnetic layers are epitaxial with respect to the silicon substrate and further wherein, the tunnel barrier oxide comprises an amorphous oxide.

2. The magnetic tunnel junction of claim 1 wherein the tunnel barrier oxide layer has a thickness of no more than about 4 nanometers.

3. The magnetic tunnel junction of claim 1 further comprising a buffer layer disposed between the silicon substrate and the first ferromagnetic layer.

4. The magnetic tunnel junction of claim 3 wherein:
   (a) the tunnel barrier oxide comprises an oxide selected from the group consisting of aluminum oxides, yttrium oxides, silicon oxides, chromium oxides, manganese oxides, titanium oxides, tantalum oxides, magnesium oxides, calcium oxides, hafnium oxides, zirconium oxides, niobium oxides and gallium oxides;
   (b) the first and second ferromagnetic layers comprise ferromagnetic materials independently selected from the group consisting of cobalt, nickel, cobalt/iron alloys of cobalt and iron and alloys of nickel and iron; and
   (c) the buffer layer comprises tantalum, copper or gold.

5. The magnetic tunnel junction of claim 1 wherein the tunnel barrier oxide layer comprises a metal oxide or a metal alloy oxide.

6. The magnetic tunnel junction of claim 1 wherein the tunnel barrier oxide layer comprises a transition metal oxide.

7. The magnetic tunnel junction of claim 1 wherein the tunnel barrier oxide layer comprises aluminum oxide.

8. The magnetic tunnel junction of claim 7 wherein the first and second ferromagnetic layers comprise cobalt.

9. The magnetic tunnel junction of claim 7 wherein the first and second ferromagnetic layers comprise nickel.

10. The magnetic tunnel junction of claim 7 wherein the first and second ferromagnetic layers comprise an alloy of cobalt and iron.

11. The magnetic tunnel junction of claim 7 wherein the first and second ferromagnetic layers comprise an alloy of nickel and iron.

12. The magnetic tunnel junction of claim 1 wherein the tunnel barrier oxide comprises yttrium oxide.

13. The magnetic tunnel junction of claim 12 wherein the first and second ferromagnetic layers comprise cobalt.

14. The magnetic tunnel junction of claim 12 wherein the first and second ferromagnetic layers comprise nickel.

15. The magnetic tunnel junction of claim 12 wherein the first and second ferromagnetic layers comprise an alloy of cobalt and iron.

16. The magnetic tunnel junction of claim 12 wherein the first and second ferromagnetic layers comprise an alloy of nickel and iron.

17. The magnetic tunnel junction of claim 1 wherein the tunnel barrier oxide comprises an oxide selected from the group consisting of silicon oxides, chromium oxides, manganese oxides, titanium oxides, tantalum oxides, magnesium oxides, calcium oxides, hafnium oxides, zirconium oxides, niobium oxides and gallium oxides.

18. The magnetic tunnel junction of claim 1 wherein the first and second ferromagnetic layers comprise ferromagnetic materials independently selected from the group consisting of cobalt, nickel, alloys of cobalt and iron and alloys of nickel and iron.

19. A magnetic tunnel junction comprising:
(a) a substrate;
(b) a first ferromagnetic layer disposed above the substrate;
(c) an amorphous tunnel barrier oxide layer deposited on the first ferromagnetic layer; and
(d) a second ferromagnetic layer deposited on the tunnel barrier oxide layer;
wherein the first and second ferromagnetic layers are epitaxial with respect to the substrate.

20. The magnetic tunnel junction of claim 19, further comprising a buffer layer disposed between the first ferromagnetic layer and the substrate.

21. The magnetic tunnel junction of claim 19 wherein the tunnel barrier oxide layer has a thickness of no more than about 4 nanometers.

22. The magnetic tunnel junction of claim 19 wherein:
(a) the tunnel barrier oxide layer comprises an oxide selected from the group consisting of aluminum oxides, yttrium oxides, silicon oxides, chromium oxides, manganese oxides, titanium oxides, tantalum oxides, magnesium oxides, calcium oxides, hafnium oxides, zirconium oxides, niobium oxides and gallium oxides; and
(b) the first and second ferromagnetic layers comprise ferromagnetic materials independently selected from the group consisting of cobalt, nickel, alloys of cobalt and iron and alloys of nickel and iron.

* * * * *